United States Patent
Lee et al.

(10) Patent No.: US 7,407,080 B2
(45) Date of Patent: Aug. 5, 2008

(54) WIRE BOND CAPILLARY TIP

(75) Inventors: Kenny Lee, Seoul (KR); Hun-Teak Lee, Ichon-si (KR); Jong Kook Kim, Suwon-si (KR); Chulsik Kim, Ichon-si (KR); Ki-Youn Jang, Incheon (KR)

(73) Assignee: Chippac, Inc., Fremont, CA (US)

( * ) Notice: Subject to any disclaimer, the term of this patent is extended or adjusted under 35 U.S.C. 154(b) by 30 days.

(21) Appl. No.: 10/971,202

(22) Filed: Oct. 22, 2004

(65) Prior Publication Data
US 2005/0218188 A1 Oct. 6, 2005

Related U.S. Application Data

(60) Provisional application No. 60/558,813, filed on Apr. 2, 2004.

(51) Int. Cl.
*B23K 37/00* (2006.01)
(52) U.S. Cl. ...................................... 228/4.5
(58) Field of Classification Search .................. 228/4.5, 228/1.1, 6.1, 6.2, 180.5; 219/56.21, 56.22
See application file for complete search history.

(56) References Cited

U.S. PATENT DOCUMENTS

| | | | |
|---|---|---|---|
| 4,437,604 A | 3/1984 | Razon et al. | |
| 4,860,941 A | 8/1989 | Otto | |
| 5,226,582 A | 7/1993 | Kubota et al. | |
| 5,465,899 A | 11/1995 | Quick et al. | |
| 5,544,804 A * | 8/1996 | Test et al. | 228/180.5 |
| 5,558,270 A * | 9/1996 | Nachon et al. | 228/180.5 |
| 5,559,054 A | 9/1996 | Adamjee | |
| 5,842,628 A | 12/1998 | Nomoto et al. | |
| 5,871,141 A * | 2/1999 | Hadar et al. | 228/180.5 |
| 5,874,780 A | 2/1999 | Murakami | |
| 5,938,105 A | 8/1999 | Singh | |
| 5,954,260 A | 9/1999 | Orcutt | |
| 5,960,262 A | 9/1999 | Torres et al. | |
| 5,984,162 A | 11/1999 | Hortaleza et al. | |
| 6,065,667 A * | 5/2000 | Singh | 228/180.5 |
| 6,155,474 A | 12/2000 | Orcutt | |
| 6,207,549 B1 | 3/2001 | Higashi et al. | |
| 6,213,378 B1 * | 4/2001 | Singh | 228/110.1 |
| 6,232,211 B1 | 5/2001 | Tsukahara | |
| 6,295,729 B1 | 10/2001 | Beaman et al. | |
| 6,325,269 B1 * | 12/2001 | Suzuki et al. | 228/4.5 |

(Continued)

FOREIGN PATENT DOCUMENTS

JP 2002-368034 A * 12/2002

*Primary Examiner*—Kevin P Kerns

(57) ABSTRACT

A capillary tip for a wire bonding tool has a chamfer provided with at least one annular groove. The annular groove is generally oriented in a plane perpendicular to the axis of the capillary. In a sectional view through the capillary axis, the groove profile may be generally part-oval or part circular, such as semicircular or half-oval; or generally rectangular; or generally triangular. In some embodiments the width of the groove profile at the face of the chamfer is at least about one-tenth, more usually at least about one-fifth, the length of the chamfer face; and less than about one-half, more usually less than about one-third, the length of the chamfer face. In some embodiments two or more such grooves are provided. The grooved chamfer can improve the transmission of ultrasonic energy to the wire ball during formation of the bond.

18 Claims, 4 Drawing Sheets

U.S. PATENT DOCUMENTS

| | | | |
|---|---|---|---|
| 6,457,627 B1 * | 10/2002 | Komiyama | 228/4.5 |
| 6,499,648 B2 * | 12/2002 | Shieh et al. | 228/110.1 |
| 6,595,406 B2 * | 7/2003 | Chapman et al. | 228/180.5 |
| 6,910,612 B2 * | 6/2005 | Perlberg et al. | 228/4.5 |
| 2005/0121493 A1 * | 6/2005 | Mironescu et al. | 228/4.5 |

* cited by examiner

WIRE BOND CAPILLARY TIP

CROSS-REFERENCE TO RELATED APPLICATIONS

This application claims priority from U.S. Provisional Application No. 60/558,813, filed Apr. 2, 2004, titled "Wire bond capillary tip".

BACKGROUND

This invention relates to wire bond interconnection in semiconductor packaging.

Fine wires are commonly used to make electrical interconnections between contact sites in semiconductor packages. The contact sites may be, for example, an interconnect pad on a die and a bond finger on a lead frame or a bond site on a substrate. Typically a ball is formed at one end of the wire and the ball is bonded to a first contact site. Then the wire is carried to a second contact site, forming a loop, and is stitch bonded (wedge bonded) at the second site to complete the interconnection. The wire is then broken at the end of the wedge bond, forming a new free end on which a ball can be formed to repeat the process to form interconnections between another pair of contact sites.

Wire bonding is an automated process, employing a wire bonding tool that operates robotically according to programmed instructions. In a conventional wire bonding tool a bond wire, which is typically gold, is run off a spool and threaded through the lumen of a hollow, pointed ceramic capillary. A free end of the wire projects beyond the tip of the capillary. A molten ball is formed at the free end of the wire (a so-called free air ball), typically by employing an electrode near the wire to strike a high voltage electric arc. The bonding site and the capillary are heated, and the capillary is maneuvered to press the free air ball against the bonding site, and ultrasonic energy is applied through the capillary and the ball as the ball hardens and the bond is formed. Typically the ultrasonic energy is supplied to the capillary from an ultrasound source by way of a transducer.

The quality of the interconnection depends upon suitable combinations of materials constituting the wire and contact site, and upon suitable combinations of temperature, pressure, ultrasonic energy, and the timing of events during bond formation. In particular, it is important to apply an effective amount of ultrasonic energy in a controlled manner.

SUMMARY

According to the invention, a capillary tip for a wire bonding tool has a chamfer provided with at least one annular groove. The annular groove is generally oriented in a plane perpendicular to the axis of the capillary.

In some embodiments, the groove profile, viewed in a section thru the capillary axis, may be generally part-oval or part circular, such as half-oval or semicircular; or generally rectangular; or generally triangular. The groove need not have a regular shape in profile, nor any particular shape.

The nominal width of the groove profile at the face of the chamfer may be at least about one-tenth, in some embodiments at least about one-fifth, the length of the chamfer face; and the nominal width may be less than about one-half, in some embodiments less than about one-third, the length of the chamfer face. The depth of the groove profile is less than about the same as, in some embodiments less than about half as great as, the nominal width; and the depth may be at least about one-tenth, in some embodiments at least about one-fifth, as great as the nominal width.

In some embodiments two or more such grooves are provided; and the grooves need not have a regular shape in profile, nor any particular shape, nor need any two of the grooves be of the same shape. There may be as many as five grooves or more, and the grooves may be adjacent, or spaced apart, at the face of the chamfer.

The grooved chamfer according to the invention can improve the transmission of ultrasonic energy to the wire ball during formation of the bond.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGS. illustrating embodiments of the invention, elements corresponding to elements shown in other drawings are not all particularly renumbered, although they are all readily identifiable in all the FIGS.

Figure 1:
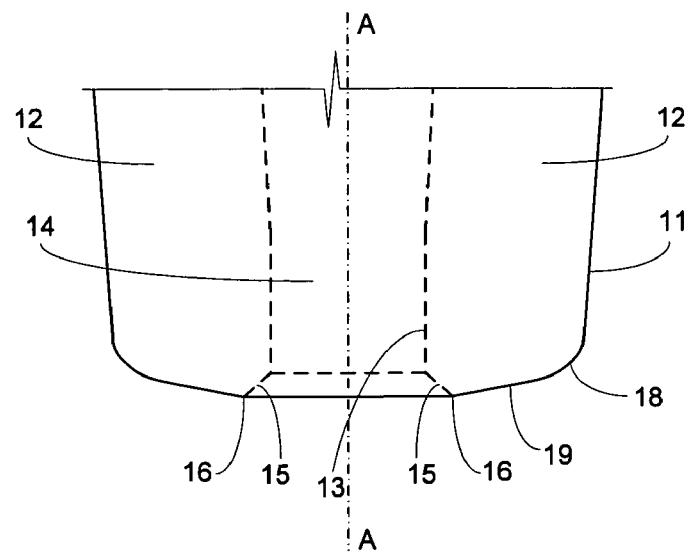
FIG. 1 (PRIOR ART) is a diagrammatic sketch in a side view showing a tip portion of a wire bonding capillary tip.

Turning now to FIG. 1, there is shown a portion of the tip of a wire bonding capillary, in a side view. The capillary wall 12 is defined by an outer surface 11 and an inner, lumenal, surface 13, providing a capillary lumen 14 through which the wire is threaded. The capillary and its lumen typically have a circular cross-section about an axis A-A. The capillary tip outer surface 11 is typically tapered, so that it narrows toward the end. At the tip, the capillary ends in a face 19, and the outer rim of the face 19 is typically rounded where it meets the outer surface 11, as indicated at 18. The opening of the capillary is provided with a chamfer 15, defining an inner rim 16 where the chamfer meets the face.

Figure 2:
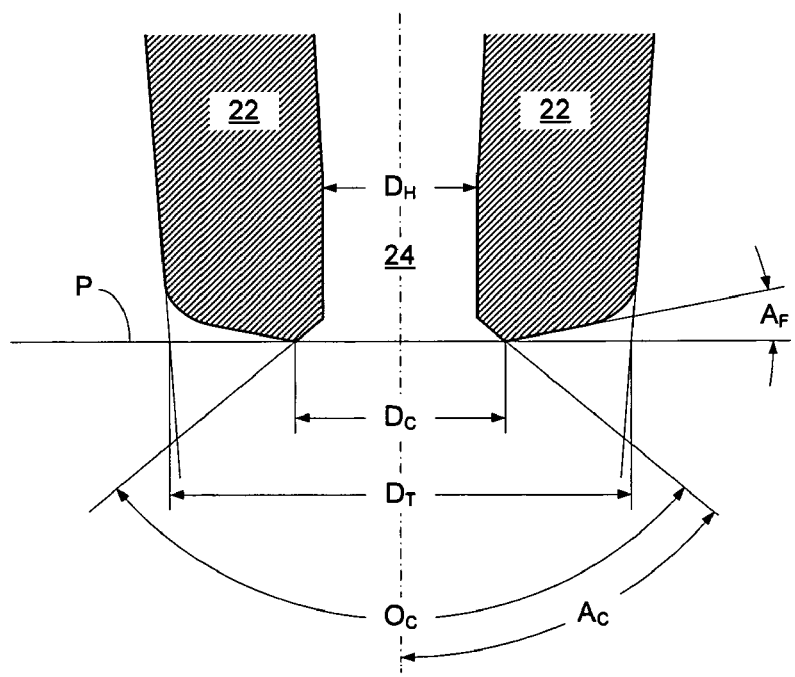
FIG. 2 (PRIOR ART) is a diagrammatic sketch in a sectional view in a plane containing the capillary axis showing a tip portion of a wire bonding capillary tip as in FIG. 1.

Certain features of the capillary tip of FIG. 1 are pointed out in sectional view in FIG. 2. Capillary wall 22 defines a lumen 24 having a hole diameter $D_H$ near the tip. The chamfer is formed at a cone angle $A_C$ with respect to the capillary axis, and defines a cone opening $O_C$. The circular inner rim where the chamfer meets the face defines a plane P generally perpendicular to the capillary axis, and the circular inner rim has a chamfer diameter $D_C$. The face is slanted away from the plane of the inner rim, and defines a face angle $A_F$. The intersection of the plane of the inner rim with a projection of the tapering outer surface of the capillary tip describes a circle having a tip diameter $D_T$. The various dimensions differ according to the particular capillary tip design; by way of illustrative example, in one such design the hole diameter is about 1.0 mil (~25.4 mm); the chamfer diameter is about 1.3 mil (~33 mm); the tip diameter is about 2.6 mil (~66 mm); the face angle is about 11°; and the cone angle is about 50°. A typical wire diameter for a standard gold wire (99.99% Au) may be about 0.8 mil (~20.3 mm). Other dimensions are known. In common use, for example, are gold wires having a diameter about 1.0 mil (~25.4 mm) and larger; and capillary tips may have tip diameters in the range about 2.4 mil to about 3.8 mil; and chamfered capillary tips may have a cone angle, for example, about 30°.

Figure 3:
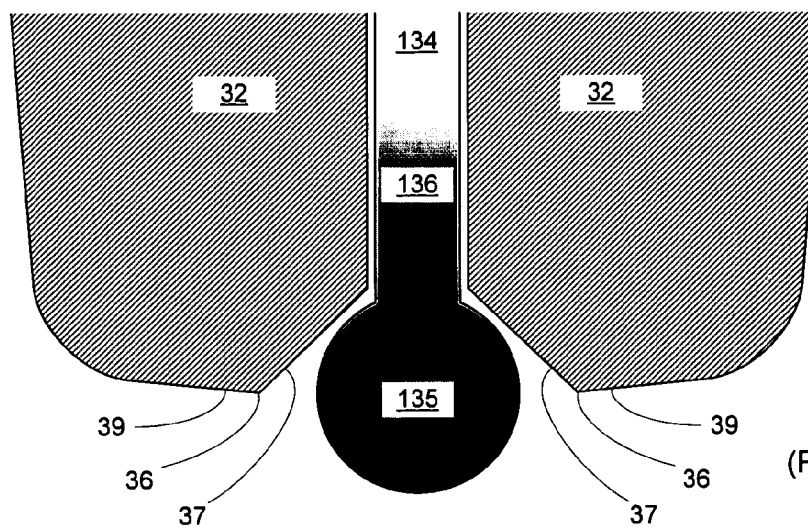
FIG. 3 (PRIOR ART) is a diagrammatic sketch in a sectional view showing a tip portion of a wire bonding capillary, illustrating a wire and molten wire ball.

FIG. 3 illustrates diagrammatically a free air ball formed at the free end of the gold wire by a high voltage arc from an adjacent electrode (not shown). The wire 134 is carried within the lumen of the capillary 32. As shown in FIG. 3, the capillary tip is provided with a face 39 and a chamfer 37 which intersect at an inner rim 36. The ball 135 is mostly (or entirely) molten and, between the molten ball and the solid wire is an intermediate region 136. The ball hangs suspended from the capillary tip. In use, as the capillary is manipulated to press the ball onto the contact surface, the chamfer contacts the ball and, as the ball is compressed by the capillary tip against the contact surface, the gold is deformed by, and to some extent conforms to, the chamfer, the inner rim, and at least a part of the face adjacent the inner rim. Accordingly, these parts of the capillary tip (and particularly the chamfer) are the principal means by which the ultrasound energy is transmitted into the gold mass as the bond is formed.

According to the invention, a capillary tip having improved performance has a chamfer provided with at least one annular groove. This feature is believed to improve the transfer of ultrasound energy from the capillary into the gold mass.

Figure 4A:
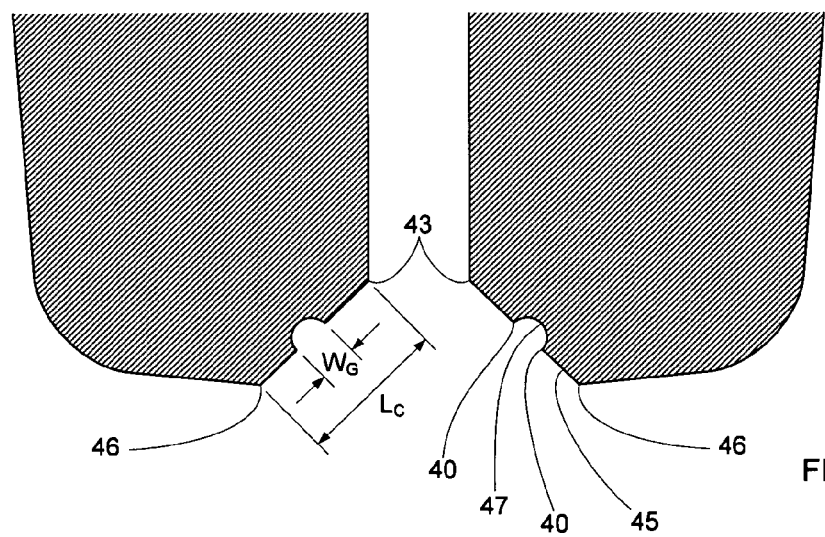
FIG. 4A is a diagrammatic sketch in a sectional view showing a tip portion of a wire bonding capillary having an annular groove in the chamfer according to an aspect of the invention.

In one exemplary embodiment, shown in FIG. 4A, the groove has a rounded profile in a sectional view. Referring now to FIG. 4A, a chamfer having a surface 45 meets the face and an inner rim 46, and meets the lumen of the capillary at an upper rim 43. The distance (in a plane containing the capillary axis) between the inner rim and the upper rim defines a chamfer length $L_C$. An annular groove 47 is formed in the chamfer surface having nominal edges 40. The groove 47 in this example has a semicircular sectional profile design (nominal) configuration, so that the nominal edges 40 define a groove width $W_G$, and the nominal depth of the groove is half the groove width. Viewed from below along the capillary axis, as shown in FIG. 4B, the groove 47 is shown to have an annular shape in a plane generally perpendicular to the capillary axis.

Figure 4B:
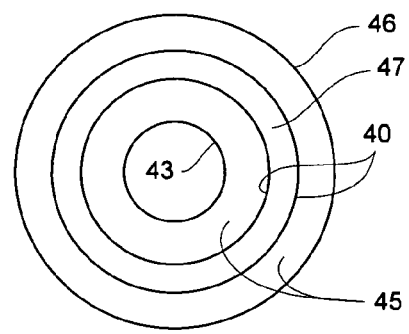
FIG. 4B is a diagrammatic sketch in a view along the capillary axis toward a capillary tip according to the invention showing the chamfer and groove as in FIG. 4A.
Figure 4C:
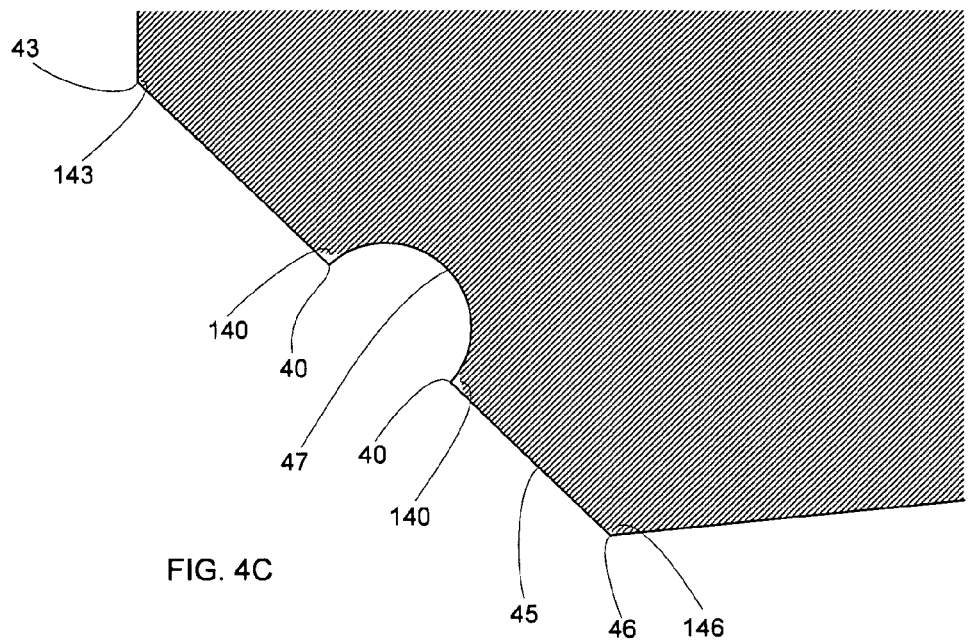
FIG. 4C is a portion of FIG. 4A, enlarged.

A portion of the grooved chamfer of FIGS. 4A and 4B is shown enlarged in FIG. 4C. Here, as in FIGS. 4A and 4B, the groove 47 is shown having edges 40 in the chamfer surface 45. Also, the inner rim 46 and the upper rim 43 are shown. These features are illustrated in their design (nominal) configurations; that is, they are sharply and geometrically defined. As may be appreciated, as manufactured these features will actually be rounded to some extent at a very small dimension, as illustrated by the shading at the actual edges 140, inner rim 146, and upper rim 143. Also, as may be appreciated, as manufactured the groove may have an actual sectional profile differing from the design (nominal) sectional profile.

The groove width $W_G$ is usually at least about 1/10, and in some embodiments at least about 1/5, of the chamfer length $L_C$. The groove width is usually no greater than about one-half, and in some embodiments no greater than about one-third, the chamfer length. The depth of the groove profile in relation to the groove width varies according to the shape of the groove profile; the groove depth is usually about the same as or less than the groove width, and some embodiments the depth is less than about half the width. The groove depth usually is at least about 1/10, and in some embodiments at least about 1/5, the groove width.

Other sectional profile design nominal configurations can be suitable according to the invention: for example, a rounded groove profile may be part-circular and less than or greater than semicircular; or a rounded groove profile may be part-oval, and for example half-oval or less than or greater than half-oval; or the groove profile may be generally rectangular, or generally triangular; or, the groove profile may be an irregular shape.

Figure 5:
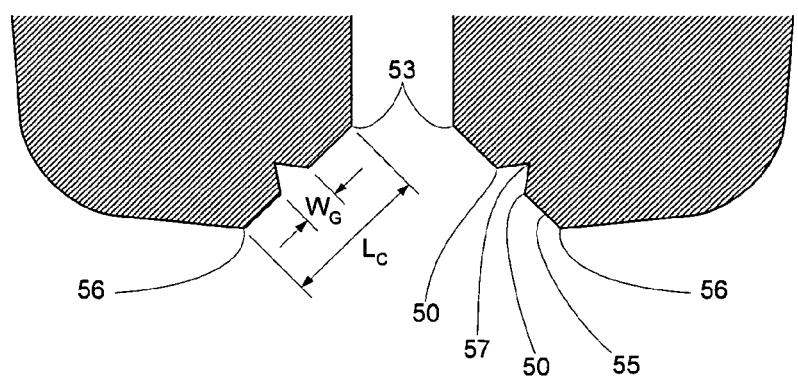
FIG. 5 is a diagrammatic sketch in a sectional view showing a tip portion of a wire bonding capillary having an annular groove in the chamfer according to another aspect of the invention.

In another embodiment of a capillary tip according to the invention, shown in FIG. 5, the chamfer 55 is provided with a groove 57 having a generally triangular profile. A chamfer length $L_C$ is defined by the distance (in a plane containing the capillary axis) between the inner rim 56 and the upper rim 53. The nominal edges 50 define a groove width $W_G$.

Figure 6:
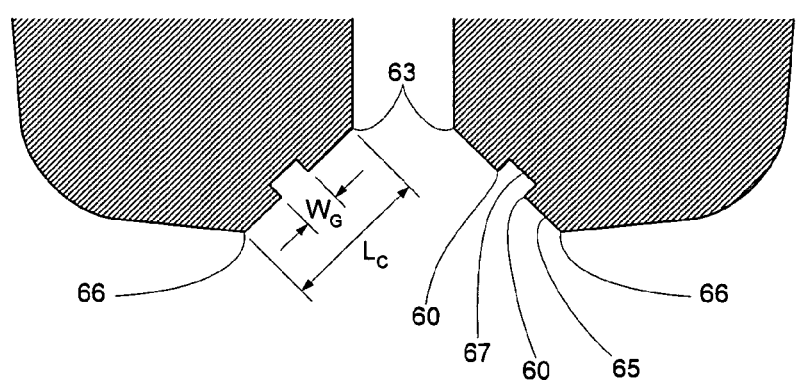
FIG. 6 is a diagrammatic sketch in a sectional view showing a tip portion of a wire bonding capillary having an annular groove in the chamfer according to another aspect of the invention.

In still another embodiment of a capillary tip according to the invention, shown in FIG. 6, the chamfer 65 is provided with a groove 67 having a generally rectangular profile. A chamfer length $L_C$ is defined by the distance (in a plane containing the capillary axis) between the inner rim 66 and the upper rim 63. The nominal edges 60 define a groove width $W_G$.

In still another embodiments according to the invention, the chamfer is provided with several (two or more) annular grooves, each of which may have any of various nominal groove profiles, as described above. There may be three, or four, or as many as five such grooves, or more, formed in the chamfer face.

Figure 7:
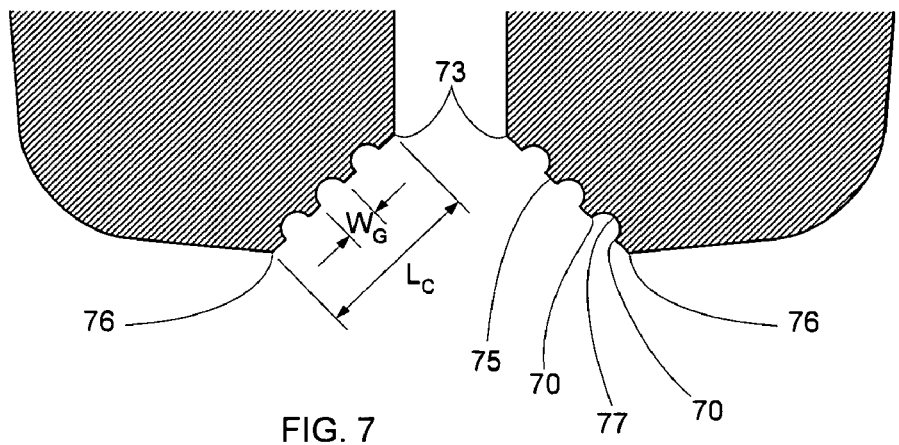
FIG. 7 is a diagrammatic sketch in a sectional view showing a tip portion of a wire bonding capillary having a plurality of annular grooves in the chamfer according to an aspect of the invention.

In one such embodiment of a capillary tip according to the invention, shown in FIG. 7, the chamfer 75 is provided with several grooves 77 (three, in this illustration) having a generally round profile (nominally semicircular, in this illustration). A chamfer length $L_C$ is defined by the distance (in a plane containing the capillary axis) between the inner rim 76 and the upper rim 73. The nominal edges 70 define a groove width $W_G$.

Figure 8:
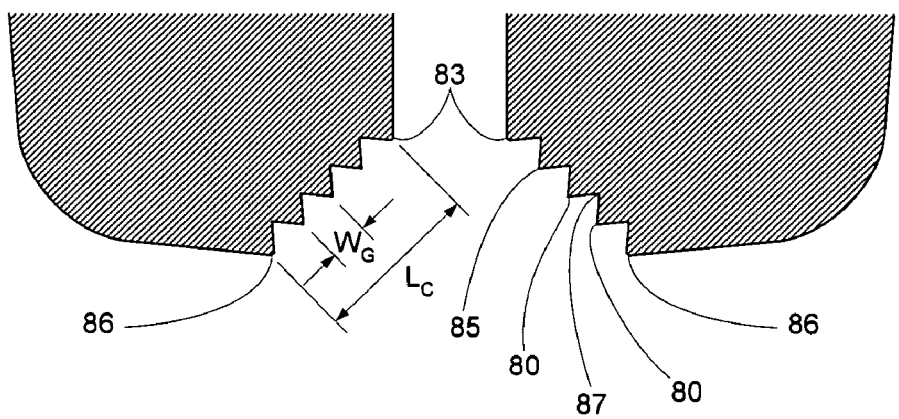
FIG. 8 is a diagrammatic sketch in a sectional view showing a tip portion of a wire bonding capillary having a plurality of annular grooves in the chamfer according to another aspect of the invention.

In another embodiment of a capillary tip according to the invention, shown in FIG. 8, the chamfer 85 is provided with several grooves 87 (four, in this illustration) having a generally polygonal profile (nominally triangular, in this illustration). A chamfer length $L_C$ is defined by the distance (in a plane containing the capillary axis) between the inner rim 86 and the upper rim 83. The nominal edges 80 define a groove width $W_G$.

Figure 9:
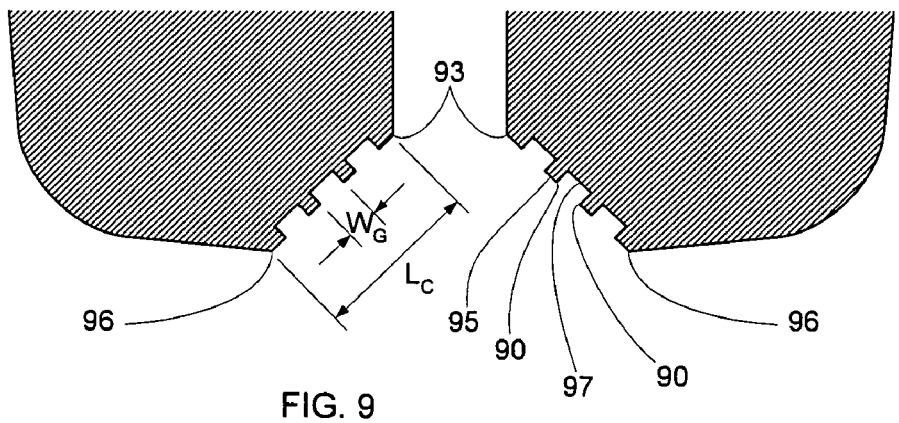
FIG. 9 is a diagrammatic sketch in a sectional view showing a tip portion of a wire bonding capillary having a plurality of annular grooves in the chamfer according to another aspect of the invention.

In still another embodiment of a capillary tip according to the invention, shown in FIG. 9, the chamfer 95 is provided with several grooves 97 (three, in this illustration) having a generally polygonal profile (nominally rectangular (half-square), in this illustration). A chamfer length $L_C$ is defined by the distance (in a plane containing the capillary axis) between the inner rim 96 and the upper rim 93. The nominal edges 90 define a groove width $W_G$.

In embodiments having two or more grooves formed in the chamfer face, the dimensions of the groove profiles may be somewhat smaller than or the larger groove profiles in the single groove embodiments. The grooves may be adjacent, or closely spaced, or spaced well apart, at the face of the chamfer; that is, the nominal edges of grooves closest to one another may not coincide, and may be separated. And, as in the single groove embodiments, the groove profiles may have shapes other than those shown in these examples; and the groove profiles need not have a regular shape.

And, as may be appreciated, as manufactured the groove edges and the inner and upper rims may be rounded according to the limits of precision of the manufacturing method.

Apparently, the groove (or grooves) in the chamfer permit the capillary tip to better engage the gold mass during bond formation, thereby providing for improved transmission of the ultrasonic energy into the gold mass, resulting in an improved bond.

The chamfer face and groove profile of the capillary tip according to the invention can be manufactured by precision cutting or erosion techniques. Suitable such techniques include, for example, laser-milling, employing directed laser energy having characteristics suitable for targeted shaping of the material of the capillary tip; or, for example, fluid-jet milling, employing a jet of fluid (such as a water jet), in which a suitable abrasive filler is entrained, directed under high pressure to targeted portions of the capillary tip. The techniques employ numerically-controlled machinery known in the art of capillary tip manufacture, and the particular configuration of the chamfer and groove profile according to the invention is formed by the numerical guidance of the machinery. The machines can be computer-controlled, and the process can be automated.

The capillary tip according to the invention can be employed in any of a variety of wire bonding applications, and the invention is particularly useful where more precise tools and more delicate machines are employed. The invention may be particularly applicable to wire bonding advanced and complicated structures, such as multiple stacked die packages; fine pitch wire bonding, bonding on low dielectric constant (and therefore soft) materials including organic materials; wire bonding on pads that are situated on overhanging portions of a stacked die. The invention can provide for improved bonding characteristics, as measured for example by intermetallic coverage, low Kirkendall void formation, and the like.

Other embodiments are within the scope of the invention.

What is claimed is:

1. A capillary for a wire bonding tool, said capillary comprising:
   a capillary tip having a chamfer having three annular grooves, the capillary having an axis and the three annular grooves oriented in planes perpendicular to the capillary axis.

2. The capillary of claim 1, proximate ones of the annular grooves being adjacent one another at the face of the chamfer.

3. The capillary of claim 1, proximate ones of the annular grooves being spaced apart from one another at the face of the chamfer.

4. The capillary of claim 1 wherein the shapes in the profiles of the grooves are regular shapes.

5. The capillary of claim 1 wherein the shapes in the profiles of the grooves are irregular shapes.

6. The capillary of claim 1 wherein the shape in profile of at least one of the grooves is a different shape from that of at least one other one of the grooves.

7. A capillary for a wire bonding tool, said capillary comprising:
   a capillary tip having a chamfer having four annular grooves, the capillary having an axis and the four annular grooves oriented in planes perpendicular to the capillary axis.

8. The capillary of claim 7, proximate ones of the annular grooves being adjacent one another at the face of the chamfer.

9. The capillary of claim 7, proximate ones of the annular grooves being spaced apart from one another at the face of the chamfer.

10. The capillary of claim 7 wherein the shapes in the profiles of the grooves are regular shapes.

11. The capillary of claim 7 wherein the shapes in the profiles of the grooves are irregular shapes.

12. The capillary of claim 7 wherein the shape in profile of at least one of the grooves is a different shape from that of at least one other one of the grooves.

13. A capillary for a wire bonding tool, said capillary comprising:
    a capillary tip having a chamfer having five annular grooves, the capillary having an axis and the five annular grooves oriented in planes perpendicular to the capillary axis.

14. The capillary of claim 13, proximate ones of the annular grooves being adjacent one another at the face of the chamfer.

15. The capillary of claim 13, proximate ones of the annular grooves being spaced apart from one another at the face of the chamfer.

16. The capillary of claim 13 wherein the shapes in the profiles of the grooves are regular shapes.

17. The capillary of claim 13 wherein the shapes in the profiles of the grooves are irregular shapes.

18. The capillary of claim 13 wherein the shape in profile of at least one of the grooves is a different shape from that of at least one other one of the grooves.

* * * * *